(12) United States Patent
Ohbayashi et al.

(10) Patent No.: US 6,475,001 B2
(45) Date of Patent: Nov. 5, 2002

(54) ULTRAMINIATURE OPTICAL JACK

(75) Inventors: Yoshiaki Ohbayashi, Nara; Keiji Mine, Osaka; Hiroshi Nakagawa, Kyoto, all of (JP)

(73) Assignee: Hosiden Corporation, Osaka (JP)

( * ) Notice: Subject to any disclaimer, the term of this patent is extended or adjusted under 35 U.S.C. 154(b) by 0 days.

(21) Appl. No.: 10/020,677

(22) Filed: Oct. 30, 2001

(65) Prior Publication Data

US 2002/0052150 A1 May 2, 2002

(30) Foreign Application Priority Data

Nov. 1, 2000 (JP) ........................................ 2000-334439

(51) Int. Cl.[7] .......................... H01R 12/00; H05K 1/00; H01K 3/00
(52) U.S. Cl. ........................... 439/83; 439/490; 439/668
(58) Field of Search ......................... 439/83, 488, 489, 439/490, 668, 669

(56) References Cited

U.S. PATENT DOCUMENTS

| | | | | |
|---|---|---|---|---|
| 5,601,451 A | * | 2/1997 | Driones et al. ............. | 439/490 |
| 5,915,993 A | * | 6/1999 | Belopolsky et al. ......... | 439/490 |
| 5,928,035 A | * | 7/1999 | Jankowsky et al. ......... | 439/607 |
| 5,975,943 A | * | 11/1999 | Chou et al. ................. | 439/490 |
| 6,093,058 A | * | 7/2000 | Wu ............................. | 439/607 |
| 6,152,762 A | * | 11/2000 | Marshall et al. ............ | 439/489 |
| 6,190,205 B1 | * | 2/2001 | Wu ............................. | 439/607 |
| 6,224,409 B1 | * | 5/2001 | Chang ......................... | 439/188 |
| 6,224,417 B1 | * | 5/2001 | Belopolsky et al. ........ | 439/490 |
| 6,238,249 B1 | * | 5/2001 | Kuwamura .................. | 439/668 |
| 6,283,786 B1 | * | 9/2001 | Margulis et al. ............ | 439/488 |
| 6,312,267 B1 | * | 11/2001 | Wang .......................... | 439/669 |
| 6,319,062 B1 | * | 11/2001 | Ma et al. ..................... | 439/490 |
| 6,328,595 B1 | * | 12/2001 | Chang ......................... | 439/490 |
| 6,336,825 B1 | * | 1/2002 | Seefried ...................... | 439/488 |
| 6,361,332 B1 | * | 3/2002 | Froude et al. ............... | 439/570 |

* cited by examiner

*Primary Examiner*—Tho D. Ta
*Assistant Examiner*—Edwin A. León
(74) *Attorney, Agent, or Firm*—David N. Lathrop, Esq.; Gallagher & Lathrop

(57) ABSTRACT

A metal cover 21 is mounted on the rear end side of a body 11 to cover its top, both side surfaces and read end face, and the metal cover 21 has a pair of soldering portions 25, which are soldered to a circuit board so that the body 11 is pressed and fixed to the circuit board.

18 Claims, 5 Drawing Sheets

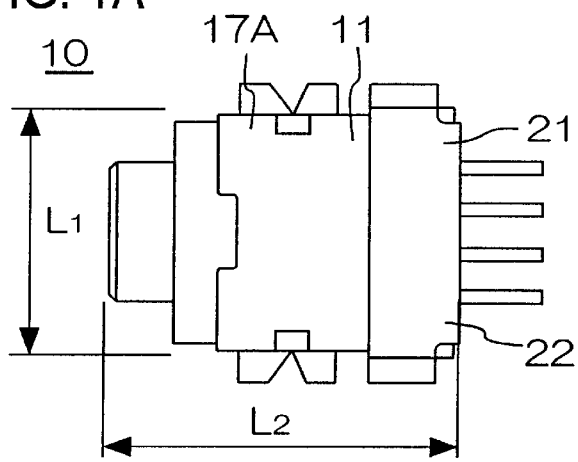
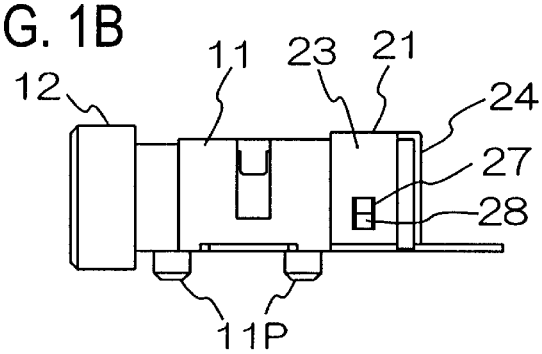
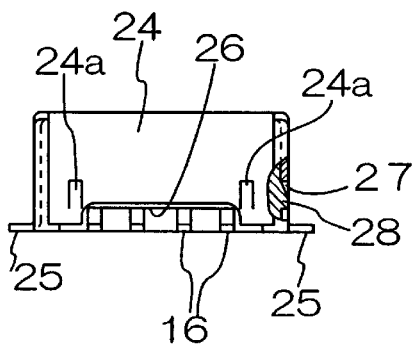
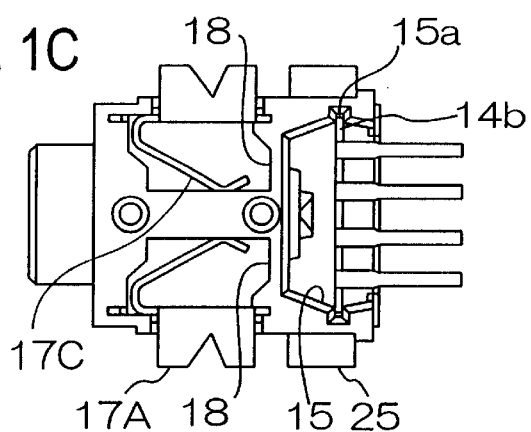
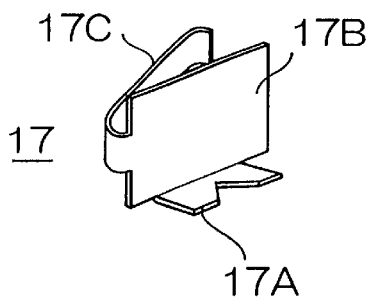
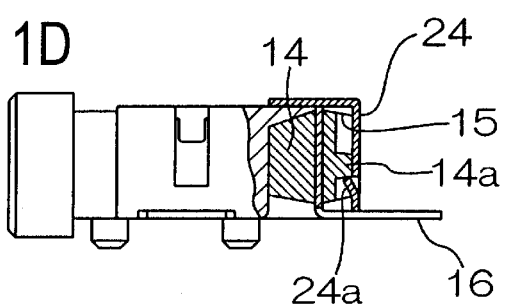
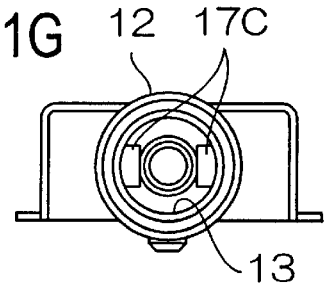

ULTRAMINIATURE OPTICAL JACK

BACKGROUND OF THE INVENTION

The present invention relates to an optical jack for receiving an optical plug holding an optical fiber and, more particularly, to an ultraminiature optical jack that is incorporated in small, portable electronic equipment such as digital audio equipment, portable telephone or portable data terminal.

There is widely used an optical jack (a connector for photoelectric conversion) that contains a luminous element or light receiving element in its body and transmits and receives light between it and an optical fiber of the optical plug inserted in a sleeve provided at one end of the jack body. With downsizing of small, portable electronic equipment, further miniaturization of such an optical jack is particularly demanded.

At present, there is widespread an optical plug having a diameter of 3.5 mm and a length of 15 mm, and to comply with such specifications, a so-called 3.5 optical jack is now used. Since, however, there are already proposed small-diameter optical plugs, for example, 2.5 and 2 mm in diameter, it is necessary to offer ultraminiature optical jacks that meet such specifications.

Usually, the optical jack of this kind is mounted on a circuit board by soldering. As the optical jack is miniaturized, its soldering strength (mounting strength) lowers and cannot sufficiently withstand forces applied when the mating optical plug is inserted into and removed from the jack or when it is pinched.

SUMMARY OF THE INVENTION

It is therefore an object of the present invention to provide an ultraminiature optical jack that achieves sufficient mounting strength.

Another object of the present invention is to provide an ultraminiature optical jack that achieves required mounting strength but can be reduced in depth.

According to the present invention, there is provided an ultraminiature optical jack that is mounted on a circuit board, for receiving an optical plug having a length-to-diameter ratio of less than 4, said optical jack comprising:
- a substantially box-shaped resin-made body having formed integrally therewith on the front end side thereof a sleeve for receiving an optical plug and having in its rear end portion a luminous element housing section open in its rear end and bottom;
- two contact piece members formed of resilient metal and received in said luminous element housing section, said contact piece members having panel portions, resilient contact pieces extended from marginal edges of said panel portions for firmly holding therebetween the peripheral surface of said optical plug inserted in said sleeve, and terminal portions extended integrally from the lower marginal edges of said panel portions and projecting squarely outwardly from the intermediate portions of the both sides of said body in its front-to-back direction, said terminal portions being soldered to said circuit board;
- a luminous element hosed in said hosing section and having a plurality of element terminals; and
- a metal cover fitted on said body to cover the top, both side surfaces and rear end face portion thereof and having a pair of soldering portions extended outwardly of both sides of said body from said metal cover, said pair of soldering portions being soldered to said circuit board.

In the ultraminiature optical jack, a notch may be formed in the portion of said metal cover covering the top of said body so that said element terminals project out rearwardly of said body through said notch.

In the ultraminiature optical jack, said element terminals may be extended downwardly from the underside of said body and said metal cover may have a rear solder joint portion extending rearwardly of said body.

In the ultraminiature optical jack, a pair of engage holes may be formed through said metal cover for engagement with engage projections formed on both side surfaces of said body.

In the ultraminiature optical jack, said body may be formed open in is rear end and the portion of said metal cover covering said open end portion may be provided with a pair of upturned projections 24a projecting toward said body 11 in a manner to prevent said luminous element from falling off said body to hold said luminous element in said housing section.

In the ultraminiature optical jack may be further provided with a metal band fitted on the front end portion of said body to cover the top and both side surfaces thereof, said metal band having at its both ends soldering portions extended outwardly of the both sides of said body.

In the ultraminiature optical jack, notches may be formed in the outside marginal edge of each of said terminal portions or a through hole may be formed through each terminal portion to provide increased interface distance.

BRIEF DESCRIPTION OF THE DRAWINGS

FIG. 1A is a plan view of an ultraminiature optical jack according to a first embodiment of the present invention;

FIG. 1B is its side view;

FIG. 1C is its bottom view;

FIG. 1D is its partly sectional view;

FIG. 1E is its rear view;

FIG. 1F is a perspective of a contact piece for use in the first embodiment;

FIG. 1G is a front view of the first embodiment;

DETAILED DESCRIPTION OF THE PREFERRED EMBODIMENTS

Figure 2A:
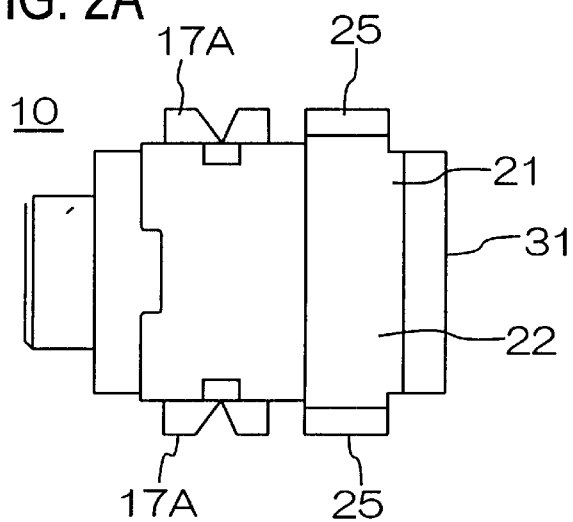
FIG. 2A is a plan view of an ultraminiature optical jack according to a second embodiment of the present invention.
Figure 2B:
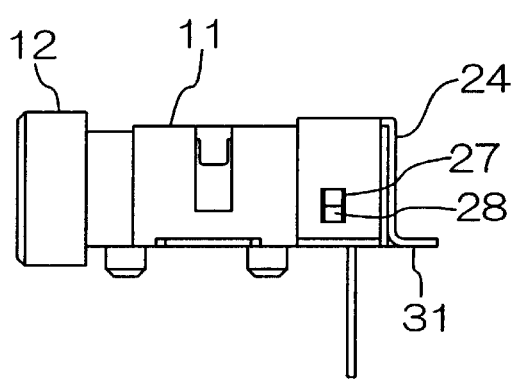
FIG. 2B is its side view.
Figure 2D:
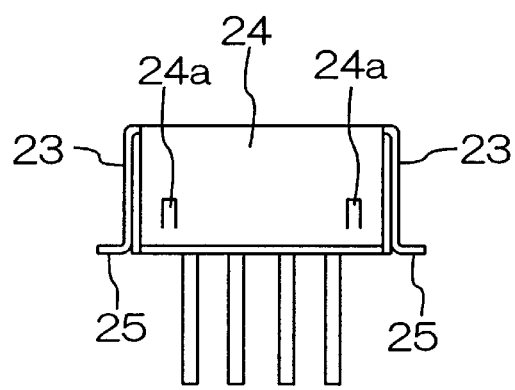
FIG. 2D is its rear view.
Figure 2C:
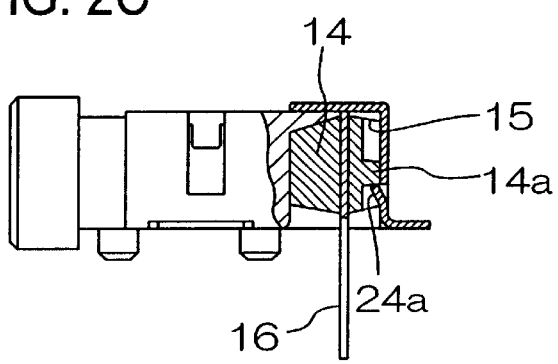
FIG. 2C is its partly sectional view.

Mention will be made first of specifications of an optical plug that is inserted into the ultraminiature optical plug of the present invention.

Let it be assumed that a miniature, small-diameter optical plug having a length-to-diameter ratio of less than 4 be inserted into the optical jack of the present invention. More specifically, the optical plug has a diameter of 2 mm and a length of about 7 mm, and hence it has a length/diameter ratio of approximately 3.5; alternatively, the optical plug is 2.5 mm in diameter and around 7 mm in length, and hence it has a length/diameter ratio of approximately 2.8. Incidentally, a conventional optical plug is 3.5 mm in diameter and 15 mm in length, and hence it has a length/diameter ratio of about 4.3.

Next, a description will be given, with reference to the accompanying drawings, of embodiments of the ultraminiature optical jack according to the present invention.

Embodiment 1

FIGS. 1A through 1G illustrate a first embodiment of the present invention. Reference numeral 10 denotes generally an optical jack of this embodiment. A substantially box-shaped jack body 11 is made of resin, and has on its front a sleeve 12 formed integrally therewith and having an insertion hole 13 for receiving the mating optical plug (not shown). The insertion hole 13 extends rearwardly so that its end is in open communication with the interior of an optical element housing section 15 formed in the rear end portion of the jack body 11. An optical element 14 is a luminous element or light receiving element, which is chosen as required.

The housing section 15 has its rear end and bottom opened, and the luminous element 14 is inserted into the housing section 15 through the underside opening of the body 11. The luminous element 14 has the opposed marginal edges thereof flanged as indicated by 14b, which are guided in a pair of guide grooves 15a of the housing section 15 when the luminous element 14 is inserted thereinto.

The luminous element 14 has, in this embodiment, four element terminals 16, which are bent downward and then extended rearwardly of the body 11. On the underside of the body 11 there are formed protrusions 11P for positioning the optical jack 10 when it is mounted on a surface-mounted circuit board.

Two contact piece members 17, one of which is shown in FIG. 1F, are each formed in one-piece of resilient sheet metal, which is composed of a substantially rectangular panel portion 17B, a terminal portion 17A extended from the lower marginal edge of the panel portion 17B at right angles thereto, and a contact piece 17C extending backward from the front marginal edge of the panel portion 17B on the side opposite the terminal portion 17A. The two contact piece members 17 are of symmetrical configuration with respect to the center axis of the sleeve 12.

The panel portions 17B and the contact pieces 17C of the two contact piece members 17 are received in a pair of recesses 18 made in the bottom of the body 11 forward of the housing section 15 in a manner to communicate with the insertion hole 13. The panel portions 17B are held against the inner wall surfaces of both side walls of the body 11. The contact pieces 17C have their tip ends located in opposed positions in the insertion hole 13, that is, in the sleeve 12. When the optical plug is inserted into the sleeve 12, the tip ends of the contact pieces 17C elastically hold therebetween a gland on the peripheral surface of the optical plug and make electric connections to the peripheral surface of the optical plug. Since the contact pieces 17C are thus short-circuited via the optical plug, the detection of the short-circuit gives a direct indication of the optical plug being inserted in the hole 13. The terminal portions 17A of the contact piece members 17 project outwardly of the lower marginal edges of the body 11.

The optical jack of the above-described construction is mounted (fixed) on a surface-mounted circuit board (not shown) by soldering the terminal portions 17A and the element terminals 16 to electrodes on the surface-mounted circuit board.

In this embodiment, the body 11 has its rear end portion covered with a metal cover 21 that covers the top, both side surfaces and rear end face of the body 11. The metal cover 21 comprises, as shown, a top panel 22, both side panels 23 and a rear end face panel 24 contacting the top, the both side surfaces and the rear end face of the body 11, respectively, and soldering portions 25 extending from extremities of the both side panels 23.

The solder point portions 25 are bent outwardly of the both sides of the body 11 at right angles thereto so that they can be soldered to the surface-mounted circuit board. Incidentally, the terminal portions 17A of the contact piece members 17 are squarely extended outwardly from the intermediate portions of the both sides in its front-to-back direction and positioned forwardly of the soldering portions 25.

On the other hand, the four element terminals 16 extended from the luminous element 14 project out rearwardly of the body 11. The rear end face panel 24 of the metal cover 21 has notches 26 to avoid contact between the element terminals 16 and the metal cover 21.

The metal cover 21 is fitted onto the body 11 from above, by which engage holes 27 made in the both side panels 23 are brought into engagement with lugs 28 protrusively provided on the both side surfaces of the body 11.

The optical jack 10 is fixed mounted on the surface-mounted circuit board by soldering thereto the soldering portions 25 of the metal cover 21 as well as the terminal portions 17A and the element terminals 16. Such fixing of the metal cover 21 to the surface-mounted circuit board sharply increases the mounting strength of the optical jack, providing sufficient mounting strength (soldering strength) even for the ultraminiature jack.

In this embodiment, the body 11 is open in the rear as shown, that is, the luminous element housing section 15 is open in its rear end, and the rear end face panel 24 covering the open rear end portion has a pair of upturned projections 24a projecting toward the body 11—this prevents the luminous element 14 from falling off the body 11, hence ensuring attachment thereto of the luminous element 14.

As described above, the open rear end portion of the housing section 15 is covered with the rear end face panel 24 of the metal cover 21, not with a wall of the same material as that of the resin-made body 11, and the luminous element 14 is prevented from falling out of the housing section 15 by the projections 24a formed on the rear end face panel 24; therefore, the optical jack can be made thin without impairing its mechanical strength and its overall depth can be reduced accordingly. When the area end wall of the housing section 15 is formed of resin, the wall thickness is required to be around 0.5 mm, but when it is replaced with the metal rear end face panel, its thickness can be reduced down to about 0.1 to 0.2 mm, 0.3 to 0.4 mm thinner than in the case of the resin wall. Thus, the optical jack can be miniaturized accordingly.

Embodiment 2

FIGS. 2A to 2D illustrate a second embodiment of the present invention. In this embodiment, the element terminals 16 project out downwardly of the underside of the body 11, and they are inserted through through holes in a circuit board and soldered thereto.

This structure permits further formation of a solder joint portion 31 that extends rearwardly of the body 11 from the extremity of the rear end face panel 24 of the metal cover 21 as shown. In addition to the pair of soldering portions 25, the rear solder joint portion 31 can also be soldered.

Accordingly, the optical jack of this embodiment can be mounted on the circuit board with higher strength by the rear solder joint portion 31.

Embodiment 3

Figure 3:
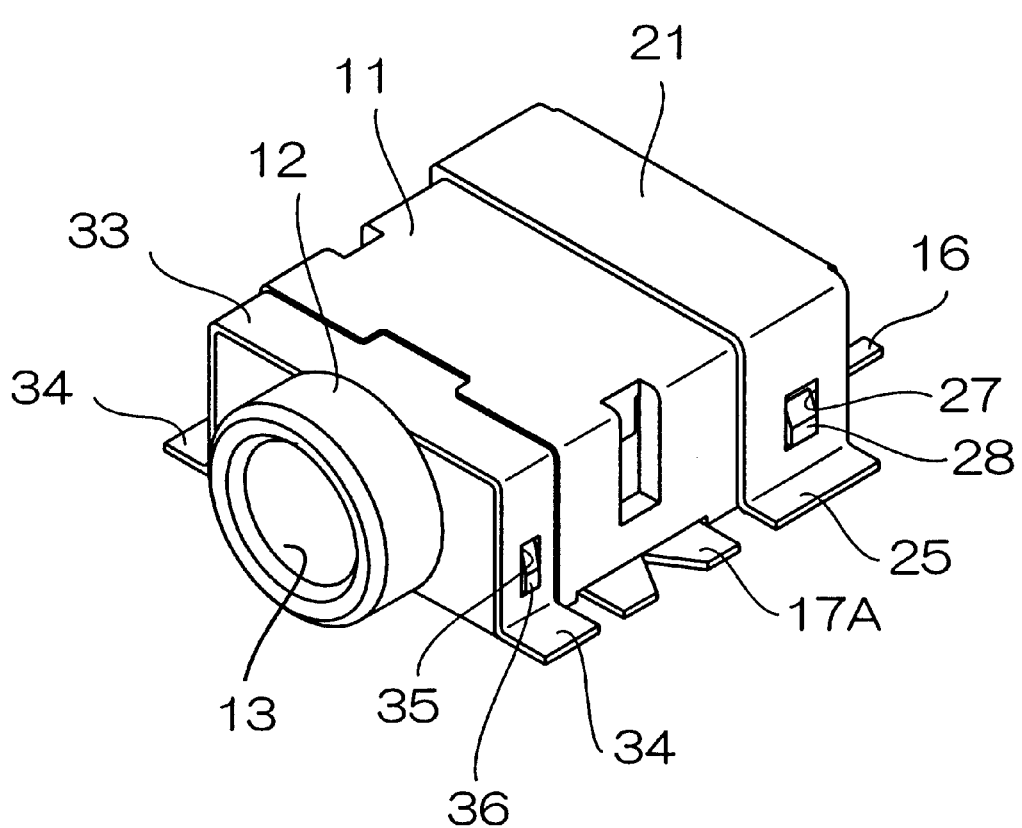
FIG. 3 is a perspective view of an ultraminiature optical jack according a third embodiment of the present invention.

FIG. 3 illustrates a third embodiment of the invention is provided with a metal band 33 for pressing the front end portion of the body 11 to the circuit board, in addition to the metal cover 21 for pressing the rear end portion of the body 11 to the circuit board in first and second embodiments.

The metal band 33 is mounted on the front end portion of the body 11 along its top and both side surfaces, and has its both ends projecting outwardly of the both sides of the body 11 to form soldering portions 34 that can be soldered to the surface-mounted circuit board.

The metal band 33 is fitted onto the body 11 from above as is the case with the metal cover 21, and engage holes 35 made in the metal band 33 are engaged with engage projections 36 formed on the both sides of the body 11.

Thus, the optical jack 10 provided with the metal cover 21 and the metal band 33 can be fixed very firmly to the circuit-mounted circuit board—this enables even an ultraminiature optical jack to achieve a high degree of reliability in its mounting on the circuit board.

Figure 4A:
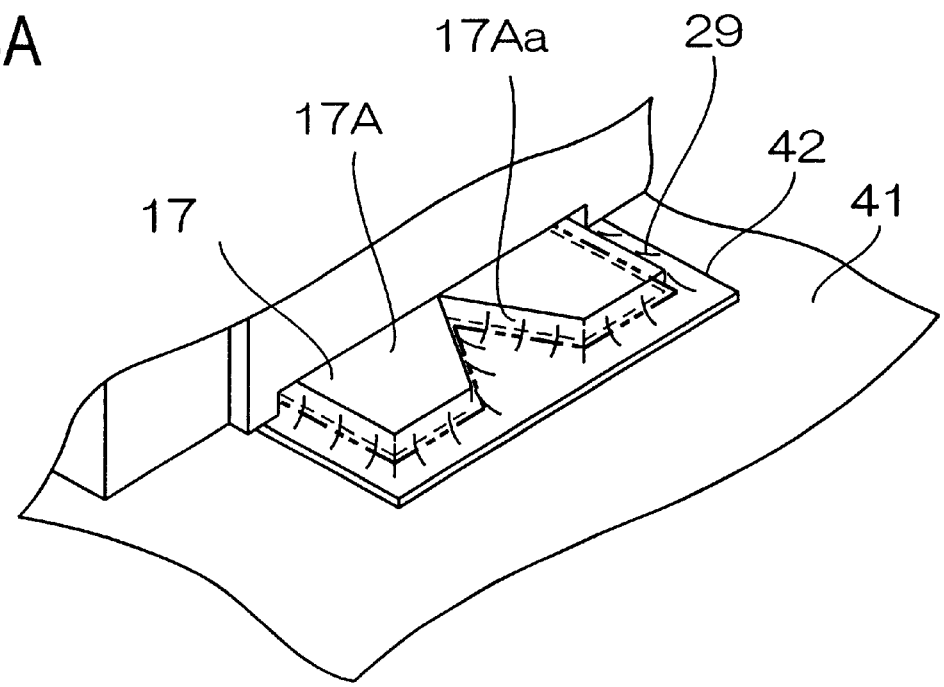
FIG. 4A is a perspective view showing soldering of terminals to a surface-mounted circuit board electrode.
Figure 4B:
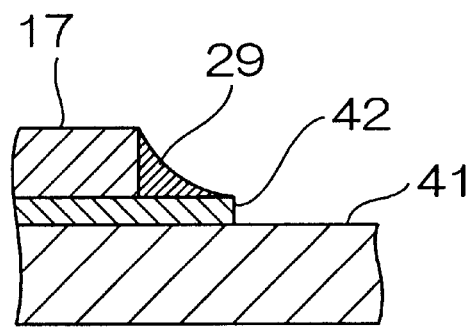
FIG. 4B is a sectional view of FIG. 4A.

In the first, second and third embodiments the terminal portion 17A of the contact piece member 17 has a V-shaped notch 17Aa made in its outside marginal portion as depicted in FIGS. 1 and 2. FIGS. 4A and 4B show how the terminal portion 17A of such a configuration is soldered to an electrode 42 of a circuit board 41. Reference numeral 29 denotes solder. As is evident from FIGS. 4A and 4B, the formation of the V-shaped notch 17Aa increases the marginal edge length or interface distance (indicated by the two-dot chain lines) over which the terminal portion 17A is soldered to the electrode 42 as compared with the case of a rectangular terminal portion with no notch 17Aa; hence, the soldering strength can be increased.

Figure 5A:
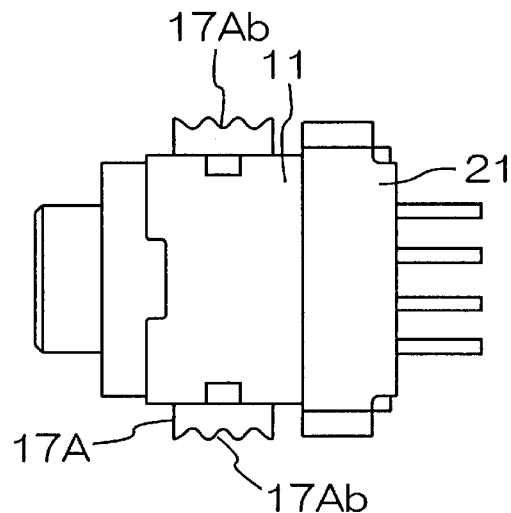
FIG. 5A is a plan view of an optical jack with terminal portions having wavy notches.
Figure 5B:
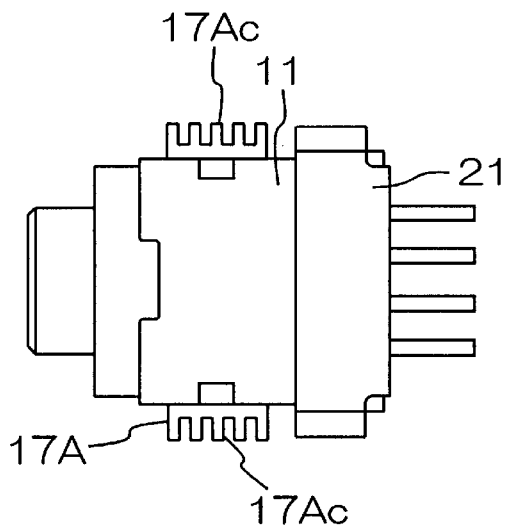
FIG. 5B is a plan view of an optical jack with terminal portions having sawtooth notches.
Figure 5C:
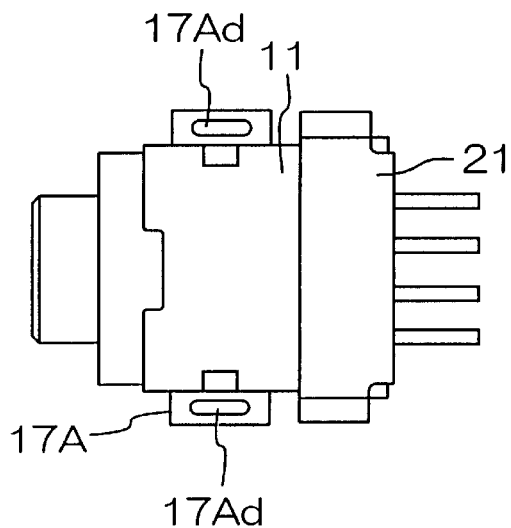
FIG. 5C is a plan view of an optical jack with terminal portions each having a through hole.

FIGS. 5A through 5C are plan views showing other configurations of the terminal portion 17A of the contact piece member 17. In FIG. 5A the formation of wavy notches 17Ab in the outside marginal edge of the terminal portion 17A provides increased interface distance. FIG. 5B depicts sawtooth notches 17Ac formed in the terminal portion 17A. FIG. 5C shows an example in which the formation of an elongated through hole in the terminal 17A increases the interface distance.

EFFECT OF THE INVENTION

As described above, since the optical jack of the present invention is provided with a metal cover that can be soldered to a circuit board to fixedly press thereto the jack body, the mounting strength (soldering strength) of the optical jack can be increased substantially. This provides sufficient mounting strength even for an ultraminiature optical jack that lacks required mounting strength when it is soldered at terminal portions alone.

Further, since the lugs protrusively provided on the metal cover ensures attachment of the luminous element to the jack body without allowing the former to fall off the latter, it is possible to dispense with the rear end face portion of the conventional resin-made jack body required to have a required thickness for the mechanical strength thereof—this permits reduction of the depth of the optical jack, allowing miniaturization of the jack accordingly.

Moreover, with the combined use of the metal cover and the metal band that can be soldered to the circuit board, the optical jack can be fixed to the board more firmly.

In addition, the formation of notches in the outside marginal edges of the terminal portion or the through hole through the terminal portion increases the interface distance, providing increased soldering strength.

What is claimed is:

1. An ultraminiature optical jack that is mounted on a circuit board, for receiving an optical plug having a length-to-diameter ratio of less than 4, said optical jack comprising:
   a substantially box-shaped resin-made body having formed integrally therewith on the front end side thereof a sleeve for receiving the optical plug and having in its rear end portion a luminous element housing section open in its rear end and bottom;
   two contact piece members formed of resilient metal and received if said body forward said luminous element housing section, said contact piece members having panel portions, resilient contact pieces extended from marginal edges of said panel portions for firmly holding therebetween a peripheral surface of said optical plug inserted in said sleeve, and terminal portions extended integrally from the lower marginal edges of said panel portions and projecting squarely outwardly from intermediate portions of the both sides of said body in its front-to-back direction, said terminal portions being soldered to said circuit board;
   a luminous element housed in said housing section and having a plurality of element terminals; and
   a metal cover fitted on said body to cover the top, both side surfaces and rear end face portion thereof and having a pair of soldering portions extended outwardly of both sides of said body from said metal cover, said pair of soldering portions being soldered to said circuit board.

2. The ultraminiature optical jack of claim 1 wherein said metal cover is held on said body with a pair of engage holes of said metal cover held in engagement with engage projections formed on both side surfaces of said body.

3. The ultraminiature optical jack of claim 1 wherein said body is open in is rear end and the portion of said metal cover covering said open end portion has a pair of upturned projections projecting toward said body in a manner to prevent said luminous element from falling off said body to hold said luminous element in said housing section.

4. The ultraminiature optical jack of claim 1 further comprising a metal band fitted on the front end portion of said body to cover the top and both side surfaces thereof, said metal band having at its both ends soldering portions extended outwardly of the both sides of said body, said soldering portions being soldered to said circuit board.

5. The ultraminiature optical jack of claim 1 wherein each of said terminal portions has formed in its outside marginal edge notches for providing increased interface distance.

6. The ultraminiature optical jack of claim 1 wherein each of said terminal portions has a through hole formed therethrough.

7. The ultraminiature optical jack of claim 1, wherein the portion of said metal cover covering the top of said body has a notch, said element terminals projecting out rearwardly of said body through said notch.

8. The ultraminiature optical jack of claim 7 wherein said metal cover is held on said body with a pair of engage holes of said metal cover held in engagement with engage projections formed on both side surfaces of said body.

9. The ultraminiature optical jack of claim 7 wherein said body is open in is rear end and the portion of said metal cover covering said open end portion has a pair of upturned projections projecting toward said body in a manner to prevent said luminous element from falling off said body to hold said luminous element in said housing section.

10. The ultraminiature optical jack of claim 7 further comprising a metal band fitted on the front end portion of said body to cover the top and both side surfaces thereof, said metal band having at its both ends soldering portions extended outwardly of the both sides of said body, said soldering portions being soldered to said circuit board.

11. The ultraminiature optical jack of claim 7 wherein each of said terminal portions has formed in its outside marginal edge notches for providing increased interface distance.

12. The ultraminiature optical jack of claim 7 wherein each of said terminal portions has a through hole formed therethrough.

13. The ultraminiature optical jack of claim 1, wherein said element terminals extend downwardly from the underside of said body and said metal cover has a rear solder joint portion extending rearwardly of said body.

14. The ultraminiature optical jack of claim 13 wherein said metal cover is held on said body with a pair of engage holes of said metal cover held in engagement with engage projections formed on both side surfaces of said body.

15. The ultraminiature optical jack of claim 13 wherein said body is open in is rear end and the portion of said metal cover covering said open end portion has a pair of upturned projections projecting toward said body in a manner to prevent said luminous element from falling off said body to hold said luminous element in said housing section.

16. The ultraminiature optical jack of claim 13 further comprising a metal band fitted on the front end portion of said body to cover the top and both side surfaces thereof, said metal band having at its both ends soldering portions extended outwardly of the both sides of said body, said soldering portions being soldered to said circuit board.

17. The ultraminiature optical jack of claim 13 wherein each of said terminal portions has formed in its outside marginal edge notches for providing increased interface distance.

18. The ultraminiature optical jack of claim 13 wherein each of said terminal portions has a through hole formed therethrough.

* * * * *